(12) United States Patent
Shimizu et al.

(10) Patent No.: US 6,211,077 B1
(45) Date of Patent: Apr. 3, 2001

(54) METHOD FOR FORMING POLYCRYSTAL SILICON FILM FOR SEMICONDUCTOR ELEMENTS

(75) Inventors: Akira Shimizu; Yukihiro Mori; Atsuki Fukazawa, all of Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/337,797

(22) Filed: Jun. 22, 1999

(30) Foreign Application Priority Data

Jun. 22, 1998 (JP) .................................................. 10-175183

(51) Int. Cl.$^7$ .................................................. H01L 21/44
(52) U.S. Cl. .............................. 438/665; 438/381; 257/65
(58) Field of Search .................................. 438/665, 381, 438/486, 488, 795, 442, 677, 684; 257/65, 66, 192, 914

(56) References Cited

U.S. PATENT DOCUMENTS

| | | |
|---|---|---|
| 5,385,863 | 1/1995 | Tatsumi et al. . |
| 5,581,092 * | 12/1996 | Takemura .............................. 257/65 |
| 5,623,243 | 4/1997 | Watanabe et al. . |
| 5,910,019 * | 6/1999 | Watanabe et al. ................... 438/488 |
| 5,989,969 * | 11/1999 | Watanabe et al. ................... 438/381 |

* cited by examiner

*Primary Examiner*—David Nelms
*Assistant Examiner*—Phuc T. Dang
(74) *Attorney, Agent, or Firm*—Knobee, Martens, Olson & Bear, LLP

(57) ABSTRACT

A rough surface made of a doped polycrystal silicon film is formed on an amorphous silicon film disposed on a semiconductor substrate, by a method including the steps of: (a) activating dangling bonds present on a surface of an amorphous silicon film; (b) forming an amorphous silicon-polysilicon mixed-phase layer on the surface of the amorphous silicon film by contacting the dangling bonds with a gas containing silane gas and dopant gas while controlling the ratio of dopant gas to silane gas to bind silicon atoms and dopant atoms to the dangling bonds; and (c) annealing the amorphous silicon-polysilicon mixed-phase layer to form polysilicon grains therefrom, thereby forming a rough surface made of doped polysilicon film. Doping can be conducted after formation of the polysilicon grains.

18 Claims, 6 Drawing Sheets

METHOD FOR FORMING POLYCRYSTAL SILICON FILM FOR SEMICONDUCTOR ELEMENTS

BACKGROUND OF THE INVENTION

1. Field of the Invention

The present invention relates to a method for manufacturing semiconductor elements and particularly for forming a polycrystal silicon film on the capacitor electrode surface.

2. Description of the Related Art

Due to the needs for more highly integrated semiconductor devices, further reduction in the cell size is being sought. Particularly in the field of the Dynamic Random Access Memory (DRAM) for which one bit is composed of one transistor and one capacitor, if the cell size is reduced, the electrode area of the capacitor is decreased, hence the capacity value is decreased. As a result, problems such as lowered data hold time and incapability in preventing memory loss caused by an alpha ray will occur.

One method to solve this problem is to use a capacitor with a three-dimensional cylinder structure or a fin structure. However, this method has techinal limitations.

As other methods, there is a method to increase the capacity value by using tantal oxide ($Ta_2O_5$) with a high induction rate or barium strontium titanate ($Ba_{(x)}Sr_{(1-x)}TiO_3$) with a strong induction film. However, this method has not been made fit for practical use.

As another notable method, there is a method called the HSG process that increases the capacity value by making the capacitor surface uneven in order to increase the surface area.

FIG. 1 roughly shows how work progresses in the HSG process. As shown in FIG. 1(a), the amorphous silicon film (1) that is the capacitor understructure electrode is formed on the intercalation layer (3) formed on the silicon substrate (8). The semiconductor substrate (8) and the amorphous silicon film (1) are linked by polycrystal silicon (9). Also, naturally formed oxide film (2) adheres to the amorphous silicon film (1). After the naturally formed oxide film (2) is washed off during pre-processing, the clean surface of the amorphous silicon film (1) is exposed. At this point, hydrogen atoms (5) are bonded to the dangling bonds on the surface of the amorphous silicon film (1) (FIG. 1(b)). This hydrogen (5) is desorbed by being heated at a processing temperature of approximately 560° C. and the surface of the amorphous silicon film (1) becomes activated (FIG. 1(c)). In an atmosphere of monosilane (SiH4) gas, the mixed-phase active layer of amorphous-polycrystal silicon (6) is then selectively formed on the activated surface area by surface reaction (FIG. 1(d)). At this point, if it is annealed at a temperature of approximately 560° C. for a predetermined time period, the mixed-phase active layer amorphous migrates with polycrystal silicon on the surface as a nucleus, crystallizes into polycrystal silicon and the polycrystal silicon grain (7) grows. As a result, highly crystalline silicon grains (HSG) (7) are formed on the amorphous silicon electrode, resulting in a rough surface (FIG. 1(e)).

Normally, phosphorus (P) is doped on the amorphous silicon electrode surface. For methods for doping phosphorus, there are such methods as Chemical Vapor Deposition (CVD equipment) and Surface-reaction thin film Formation. The former is a method for doping phosphorus at the same time the amorphous silicon film is formed. The latter is a method for selectively growing phosphorus-doped amorphous-polycrystal silicon mixed-phase active layer on the active surface of amorphous silicon.

SUMMARY OF THE INVENTION

The present invention has exploited formation of a rough polysilicon film based on selective migration of amorphous silicon out of an amorphous silicon-polysilicon mixed-phase layer. The present inventors have identified problems and resolved the same as follows:

If using the Surface-reaction thin film Formation Method, as shown in FIG. 2, when $PH_3$ gas of 1% concentration is introduced for the purpose of phosphorus doping during the active state after the heating process (FIG. 2(c)), the phosphorus atom (10) of $PH_3$ gas becomes bonded to a dangling bond (4) faster than the silicon atom of $SiH_4$ gas, and this hinders the growth of the amorphous-polycrystal silicon mixed-phase active layer after that. As a result, an uneven shape is not formed on the surface of the amorphous silicon electrode (1) (FIG. 2(e)).

On the other hand, if doping phosphorus using the CVD Method and forming the uneven surface of the amorphous silicon electrode using the HSG Method, a problem that the phosphorus concentration of the HSG surface becomes low occurs due to the lower migration rate of phosphorus (P) than that of silicon (Si). In other words, when a grain in an uneven shape caused by migration is formed, crystallization progresses by amorphous silicon atoms migrating around polycrystal silicon which acts as a nucleus. However, because the migration speed of the phosphorus atom at this point is slower than that of the silicon atom, crystallized silicon atoms make up most of the surface of the grain. As a result, the phosphorus concentration on the HSG surface decreases.

When the phosphorus concentration on the surface decreases and if we measure capacity value by changing voltage, a decrease in the capacitance occurs on negative voltage and the ratio of Cmin/Cmax worsens to 0.95~0.70. which is the ratio of the pre-HSG-formation state. As a result, after expending effort to increase the electrode surface area, the effect of capacity value increase is not obtained sufficiently.

Consequently, an object of an embodiment of the present invention is to provide a method to form an amorphous silicon electrode film with a rough surface made of a polysilicon film (polysilicon grains) by migration of amorphous silicon from an amorphous silicon-polysilicon mixed-phase layer.

Another object of an embodiment of the present invention is to provide a method to form an amorphous silicon electrode film with a rough surface generated by migration, by which the amount of phosphorus doped on the surface does not decrease, a decrease in the ratio of Cmin/Cmax is prevented and the capacitance increases effectively.

In addition, another object of an embodiment of the present invention is to form an amorphous silicon electrode film with a rough surface generated by migration, which film can be mass-produced and which excels in stability and reproducibility.

The present invention includes an aspect to provide a method for forming a rough surface made of a doped polycrystal silicon film on an amorphous silicon film disposed on a semiconductor substrate, comprising the steps of: (a) activating dangling bonds present on a surface of an amorphous silicon film; (b) forming an amorphous silicon-polysilicon mixed-phase layer on the surface of the amorphous silicon film by contacting the dangling bonds with a gas containing silane gas and dopant gas while controlling the ratio of dopant gas to silane gas to bind silicon atoms and dopant atoms to the dangling bonds; and (c) annealing the amorphous silicon-polysilicon mixed-phase layer to form polysilicon grains therefrom, thereby forming a rough surface made of doped polysilicon film.

In the above, the ratio of dopant gas to silane gas can be increased from zero to a predetermined level during formation of the amorphous silicon-polysilicon mixed-phase layer. In the above, the amount of the dopant on the surface can easily be adjusted in a wide range.

In preferable embodiments, the activation of the dangling bonds can be conducted by heating in an inert gas the amorphous silicon film to a temperature of 450° C. to 590° C. The gas may contain various proportions of silane and dopant, e.g., 5% to 60% silane gas and 0.01% to 0.5% dopant gas. Further, the annealing can be conducted at a temperature of 450° C. to 590° C. The annealing can be conducted for 1 minute to 80 minutes until polysilicon grains are formed. The silane may be $SiH_4$. and the dopant may be phosphorus (dopant gas may be $PH_3$). As silane, disilane, can also be used, and as dopant, $PH_3$ can also be used.

Another aspect of the present invention provides a method for forming a rough surface made of a doped polycrystal silicon film on an amorphous silicon film disposed on a semiconductor substrate, comprising the steps of: (a) activating dangling bonds present on a rough surface made of a non-doped or insufficiently doped polycrystal silicon film disposed on a semiconductor substrate; and (b) contacting the dangling bonds with a gas containing silane gas and dopant gas while controlling the ratio of dopant gas to silane gas to bind silicon atoms and dopant atoms to the dangling bonds, thereby doping the rough surface made of the polysilicon film. In the above embodiment, non-doped or insufficiently doped polysilicon grains can be subjected to doping.

In the above, as in the previous embodiment, the ratio of dopant gas to silane gas can be increased from zero to a predetermined level during formation of the amorphous silicon-polysilicon mixed-phase layer. Further, in preferable embodiments, activation of the dangling bonds can be conducted by heating in an inert gas the amorphous silicon film to a temperature of 450° C. to 590° C. The gas may contain 5% to 60% silane gas and 0.01% to 0.5% dopant gas. The silane and dopant may be the same as above.

In the above, the rough surface made of the non-doped or insufficiently doped polysilicon film can be obtained by the steps of: (a) forming an amorphous silicon-polysilicon mixed-phase layer on a surface of an amorphous silicon film by contacting the surface with a gas containing silane; and (b) annealing the amorphous silicon-polysilicon mixed-phase layer to form polysilicon grains therefrom, thereby forming the rough surface. Further, the method may further comprise, prior to the activation step, a step of cleaning the surface of the polysilicon grains to remove, if any, an oxide film naturally formed thereon.

In another aspect, in a method comprising the steps of: (i) forming an amorphous silicon-polysilicon mixed-phase layer on a surface of the amorphous silicon film by contacting the surface with a gas containing silane; and (ii) annealing the amorphous silicon-polysilicon mixed-phase layer to form polysilicon grains therefrom, thereby forming a rough surface made of polysilicon grains, the improvement according to an embodiment comprises (a) controlling the density of the polysilicon grains by controlling the thickness of the amorphous silicon-polysilicon mixed-phase layer in the formation step; and (b) controlling the size of the polysilicon grains by controlling the temperature and the duration of the annealing step. Although polysilicon grains can grow in various ways including the examples indicated below, in the above embodiment, the density and size of the grains can be controlled. In another embodiment, the thickness of the amorphous silicon-polysilicon mixed-phase layer can be controlled by adjusting the concentration of silane in the gas to 5% to 60%. In the annealing step, the temperature can be adjusted to 450° C. to 590° C., and the duration can be adjusted to 1 minute to 80 minutes.

DETAILED DESCRIPTION OF THE PREFERRED EMBODIMENT

Basic Processes for Forming Polysilicon Grains

Figure 1A:
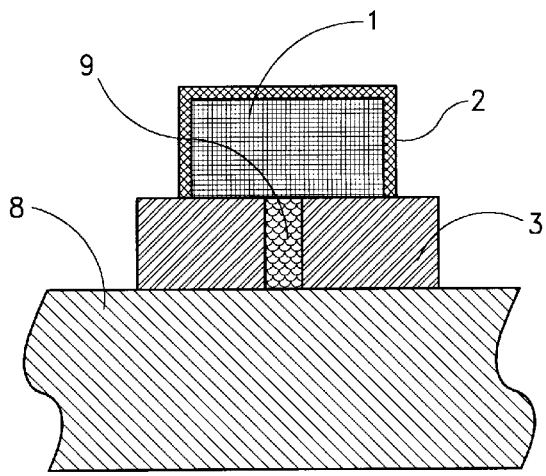
FIGS. 1(a)–1(e) is a schematic view showing a conventional HSG (highly crystalline silicon grains) process.
Figure 1B:
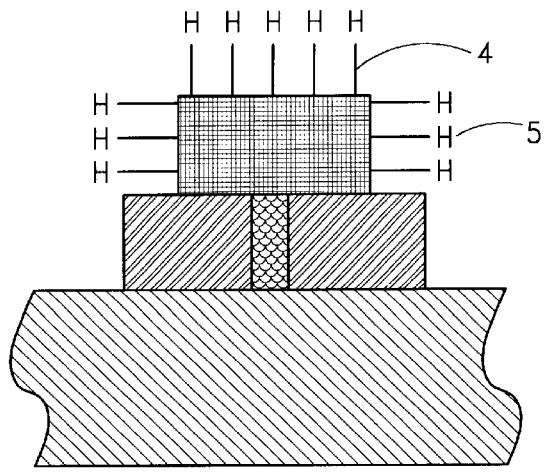
Figure 1C:
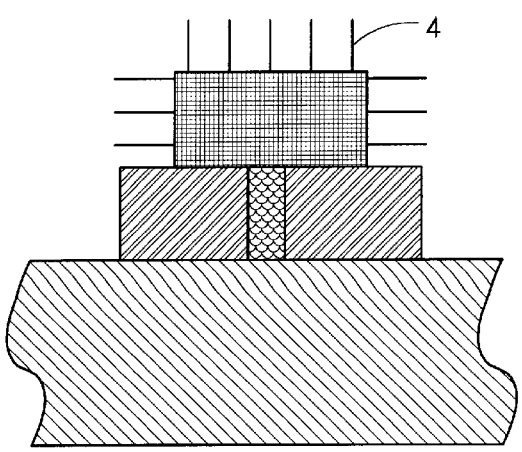
Figure 1D:
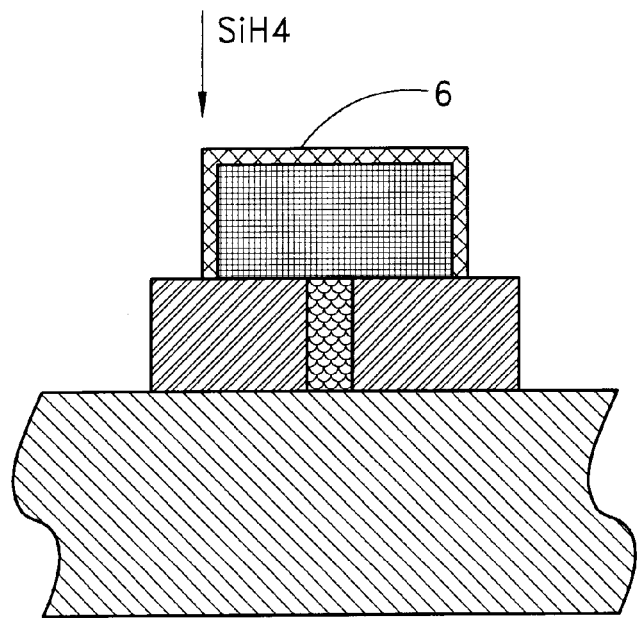
Figure 1E:
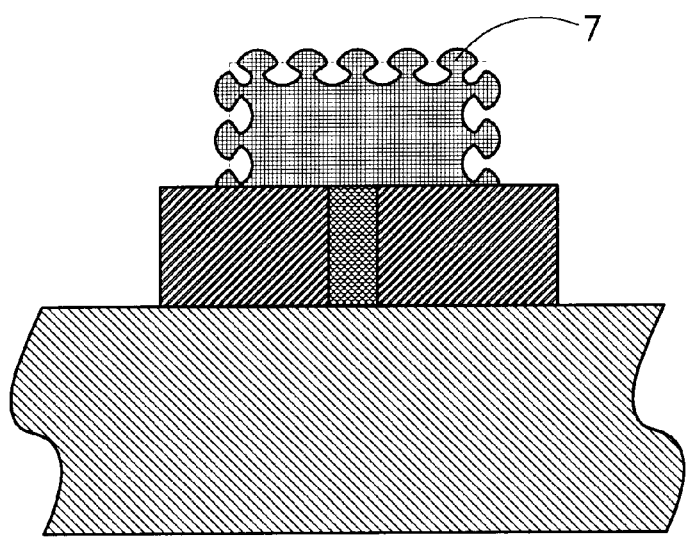
Figure 2A:
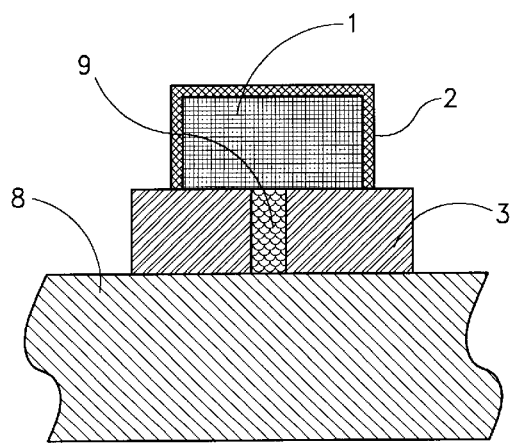
FIGS. 2(a)–2(e) is a schematic view showing a problematic HSG process according to a thin film formation method.
Figure 2D:
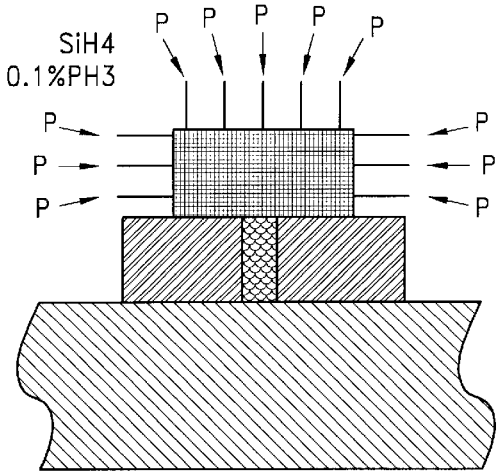
Figure 2B:
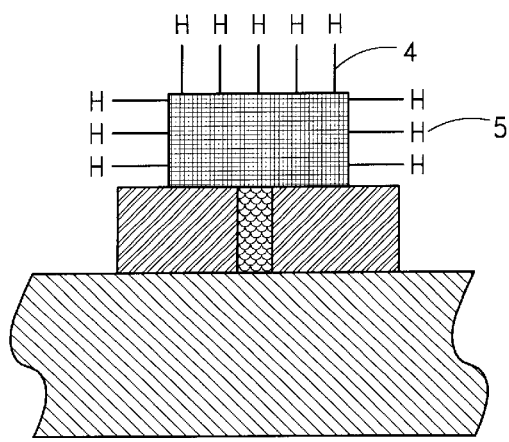
Figure 2E:
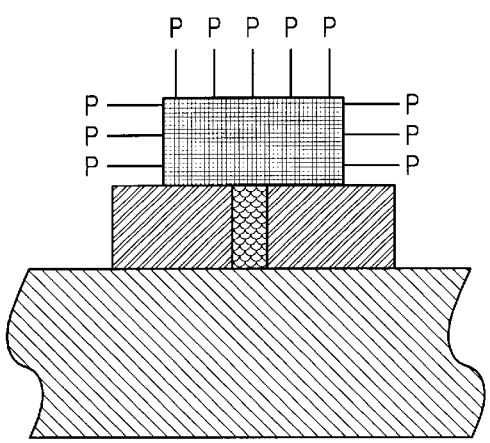
Figure 2C:
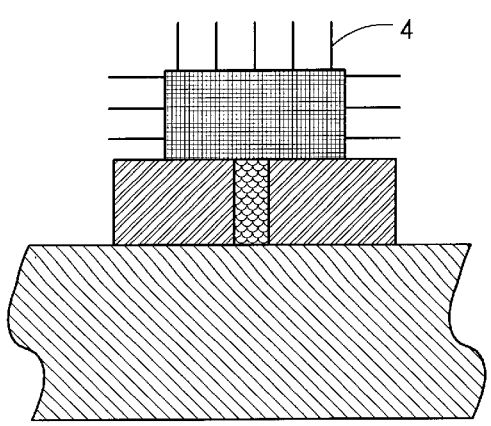

To improve conventional processes, according to an embodiment of the method of the present invention, the following processes may be conducted:

A method, which selectively forms a polycrystal silicon film in an uneven shape (rough surface) caused by migration on the amorphous silicon film accumulated on semiconductor substrate, comprises: (a) a process of substantially cleaning the surface of the amorphous silicon film, (b) a process of heating the amorphous silicon film to a predetermined temperature, (c) a process of selectively forming an amorphous silicon-polycrystal silicon mixed-phase active layer thin film on the amorphous silicon film by surface reaction in a $SiH_4$ and $PH_3$ atmosphere of a predetermined concentration, and (d) a process of crystallizing the amorphous silicon surface by annealing it at a predetermined temperature for a predetermined time period and selectively forming a polycrystal silicon film in an uneven shape caused by migration on the amorphous silicon surface, and (e) wherein it has characteristics that the density of a grain in the uneven shape is controlled by controlling the film thickness of the amorphous silicon-polycrystal silicon mixed-phase active layer thin film, and (f) the size of the grain is controlled by controlling the annealing temperature and time period.

Here preferably, in an embodiemtn, the heating temperature is from 450° C. to 590° C.

Also preferably, in another embodiment, doping is performed when the gas includes silane and dopant, e.g., the concentration of $SiH_4$ is from 5% to 60% and the concentration of $PH_3$ is from 0.01% to 0.5%.

Further, preferably, in another embodiment, the temperature for annealing is from 450° C. to 590° C. and the time period is from 1 minute to 80 minutes.

Basic Processes for Doping After Formation of Polysilicon Grains

As a variation, a method for selectively forming a polycrystal silicon film in an uneven shape (rough surface)

caused by migration on the amorphous silicon film accumulated on semiconductor substrate comprises: (a) a process of substantially cleaning the surface of the amorphous silicon film, (b) a process of heating the amorphous silicon film to a predetermined temperature, (c) a process of selectively forming an amorphous silicon-polycrystal silicon mixed-phase active layer thin film on the amorphous silicon film by surface reaction in the $SiH_4$ atmosphere of predetermined concentration, and (d) a process of crystallizing the amorphous silicon surface by annealing it at a predetermined temperature for a predetermined time period and selectively forming a polycrystal silicon film in an uneven shape caused by migration on the amorphous silicon surface, (e) wherein the density of a grain in an uneven shape can be controlled by controlling the film thickness of the amorphous silicon-polycrystal silicon mixed-phase active layer thin film, and (f) the size of the grain can be controlled by controlling the annealing temperature and time period. Furthermore, it includes (i) a process of heating the surface of the unevenly-shaped polycrystal silicon film to a predetermined temperature and (ii) a process of selectively forming phosphorus-doped polycrystal silicon on the surface of the unevenly-shaped polycrystal silicon film by surface reaction in a $SiH_4$ and $PH_3$ atmosphere of predetermined concentration, and (iii) it has a characteristic that the amount of phosphorus to be doped on the surface of the unevenly-shaped polycrystal silicon film is controlled by adjusting the flow of the $PH_3$.

Here preferably, in an embodiment, the temperature for heating the surface of the amorphous silicon film and uneven-shaped polycrystal silicon film is from 450° C. to 590° C.

Also preferably, in another embodiment, the concentration of the $SiH_4$ is from 5% to 60% and the concentration of $PH_3$ is from 0.01% to 0.5%.

Basic Processes for Doping When Oxide Film Naturally Formed on Polysilicon Grains A method for forming a phosphorus-doped polycrystal silicon thin film on the surface of polycrystal silicon in an uneven shape (rough surface) caused by migration, which is selectively formed on the amorphous silicon film accumulated on semiconductor substrate, comprises: (a) a process of substantially cleaning the surface of the uneven-shaped polycrystal silicon film, (b) a process of heating the unevenly-shaped polycrystal silicon film to a predetermined temperature, and (c) a process of selectively forming a phosphorus-doped polycrystal silicon thin film on the unevenly-shaped polycrystal silicon film by surface reaction in a $SiH_4$ and $PH_3$ atmosphere of predetermined concentration, and (d) wherein it has a characteristic that the amount of phosphorus to be doped on the surface of the uneven-shaped polycrystal silicon film is controlled by adjusting the flow of the $PH_3$.

Here preferably, in an embodiment, the temperature for heating the surface of the amorphous silicon film and unevenly-shaped polycrystal silicon film is from 450° C. to 590° C.

Also preferably, in another embodiment, the concentration of $SiH_4$ is from 5% to 60% and the concentration of $PH_3$ may be from 0.01% to 0.5%.

Basic Effects

Using the methods for manufacturing semiconductor elements in an embodiment of the present invention, an amorphous silicon electrode film with an uneven surface (rough surface) caused by migration, on which a predetermined amount of phosphorus is doped by the surface-reaction thin film formation method, can successfully be formed.

In addition, using the methods for manufacturing semiconductor elements, an amorphous silicon electrode film with an uneven surface (rough surface) caused by migration can successfully be formed without a decrease in the amount of phosphorus doped on the surface, and with a decrease in the ratio of Cmin/Cmax prevented, and with an increase in the capacitance effectively achieved.

Furthermore, using the methods for manufacturing semiconductor elements, an amorphous silicon electrode film with an uneven surface (rough surface) caused by migration, which can be mass-produced and excels in stability and reproducibility, can successfully be formed.

First Embodiment

FIG. 3 schematically illustrates the process drawing of the first implementation example of the method for manufacturing semiconductor elements based on the present invention. In addition, basically a batch-style device of the hot-wall type is used for the method based on the present invention.

This method that selectively forms a polycrystal silicon film with an uneven shape caused by migration on the amorphous silicon film accumulated on a semiconductor substrate comprises a process of substantially cleaning the surface of the amorphous silicon film, a process of heating the amorphous silicon film to a predetermined temperature, a process of selectively formiing amorphous silicon-polysilicon mixed-phase active layer thin film on the amorphous silicon film by surface reaction in a $SiH_4$ and $PH_3$ atmosphere of predetermined concentration and a process of crystallizing the amorphous silicon surface by annealing it at a predetermined temperature for a predetermined time period and selectively forming a polycrystal silicon film in an uneven shape caused by migration on the amorphous silicon surface.

Figure 3A:
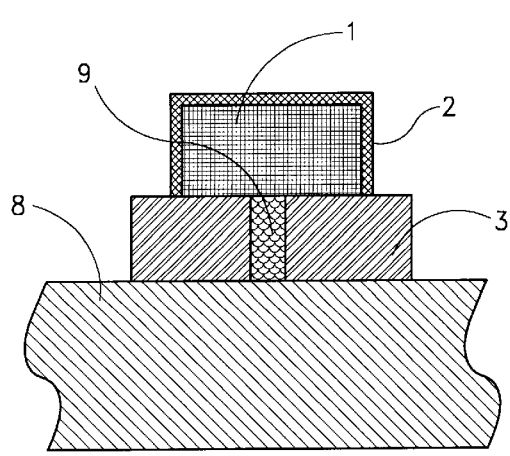
FIGS. 3(a)–3(f) is a schematic view showing a first embodiment of the method for manufacturing semiconductor elements according to the present invention.
Figure 3D:
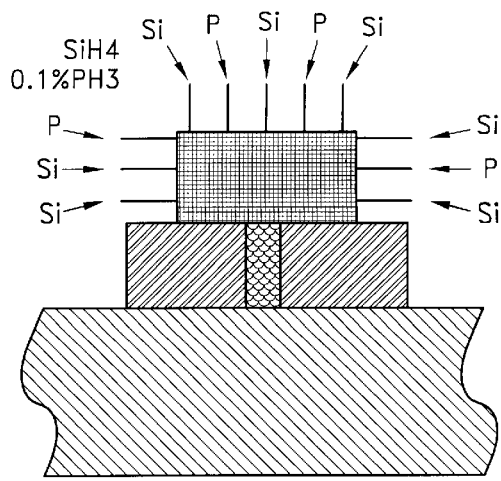

As shown FIG. 3(a), the capacitor electrode comprises the intercalation layer (3) formed evenly on the silicon substrate (8), the amorphous silicon film (1) formed on the intercalation layer (3), and polycrystal silicon (9) linking the amorphous silicon film (1) and the silicon substrate (8). Naturally formed oxide film (2) adheres to the amorphous silicon film (1).

In the first implementation example of the present invention, naturally formed oxide film is removed and the surface of the amorphous silicon film is cleaned. This is called pre-processing. To remove naturally formed oxide film, diluted HF of about 0.3% is used. The semiconductor substrate is then rinsed in de-ionized water and dried.

Figure 3B:
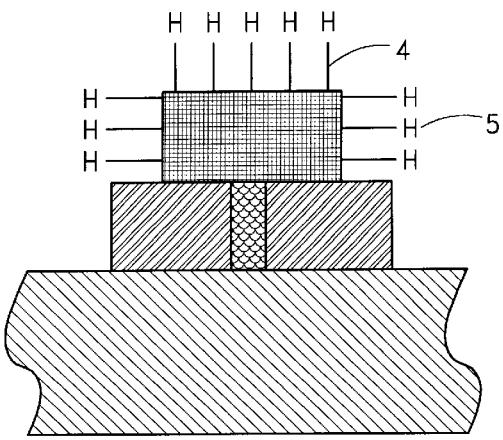
Figure 3E:
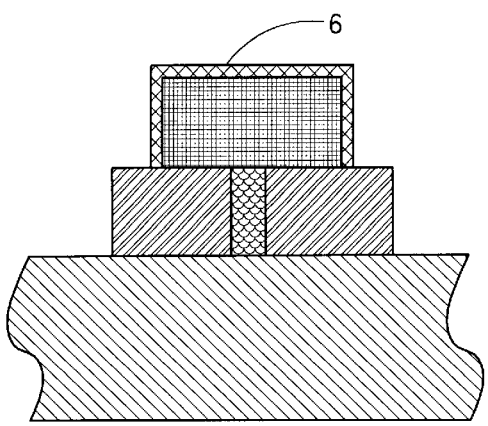
Figure 3C:
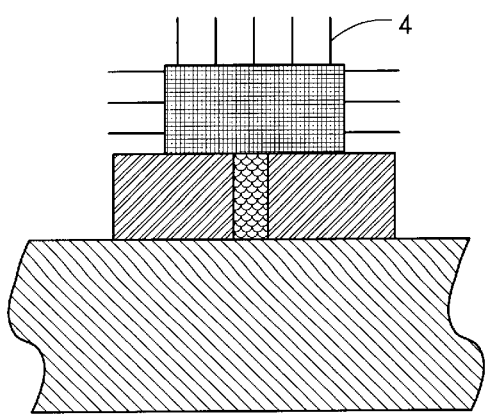
Figure 3F:
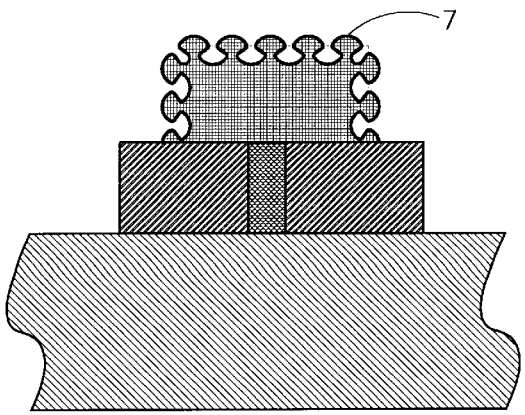

After the pre-processing is the heating process. As shown in FIG. 3(b), after the pre-processing is completed, the amorphous silicon surface is cleaned and hydrogen atoms (5) are bonded to each dangling bond (4). After drying is completed, the semiconductor substrate is injected into the evacuated cassette module by a dry pump. Then the inside of the cassette module is maintained at 1 Torr by introducing nitrogen ($N_2$). The semiconductor substrates are then conveyed one by one to the boat elevator chamber that is evacuated through the wafer transfer module which is also maintained at 1 Torr. After all semiconductor substrates have been conveyed, the wafer transfer module and the boat elevator chamber are separated by a gate valve. The boat elevator chamber then loads a boat on which the semiconductor substrates have been placed into the inside of the surface-reaction thin film formation reactor that is evacuated to a base pressure (1 E-7 Torr~1 E-10 Torr) using a turbo molecular pump. The semiconductor substrates loaded inside the reactor are heated until the temperature reaches at 450° C.~590° C. (preferably 520° C.~580° C.) for approximately 20 minutes while introducing helium (He) gas of 50 scm~200 scm. By this heating, the hydrogen on all dangling bonds is eliminated and the amorphous silicon surface becomes activated (FIG. 3(c)).

When the heating process is completed, the next process is the formation process of the amorphous silicon-polysilicon mixed-phase active layer. In the present invention, it was found that the bonding percentage of the phosphorus atom to the amorphous dangling bond can be controlled by 5%~100%, if adjusting the respective flow rate of $SiH_4$ and $PH_3$ by diluting $PH_3$ used for phosphorus doping at 0.01%~0.5% and introducing it at a low flow rate. Moreover, to obtain reproducibility, it was found that it is effective to introduce flow-controlled $SiH_4$ gas into the reactor beforehand, then to introduce flow-controlled $PH_3$ gas.

In the first implementation example of the present invention, $SiH_4$ gas diluted at 5%~60% (preferably at 30%~50%) is introduced first in the surface-reaction thin film formation reactor evacuated at 1 E-3 Torr~1 E-7 Torr. Thereafter, while reducing the helium (He) flow rate of diluted gas, $PH_3$ gas diluted at 0.01%~0.5% (preferably at 0.05%~0.2%) is introduced (FIG. 3(d)). Thus, the active amorphous-polysilicon mixed-phase active layer (6) to which phosphorus is doped at a predetermined amount has formed by surface reaction (FIG. 3(e)). At this point, the film thickness of the mixed-phase thin film of amorphous-polycrystal silicon can be controlled by changing the introduction time of $SiH_4$ gas and $PH_3$ gas, and the grain density can be controlled by adjusting this film thickness.

The last process is the annealing process. The gases are stopped after the active amorphous-polysilicon mixed-phase thin film to which phosphorus is doped at a predetermined amount has formed, and annealing process is performed continuously for 1~80 minutes under conditions where the inside of the reactor is evacuated to a base pressure (1 E-7 Torr~1 E-10 Torr) using a turbo molecular pump. The reactor temperature at this time is maintained at 450° C.~590° C. (preferably 520° C.~580° C.). With polycrystal silicon on the surface within the amorphous-polysilicon mixed-phase as a nucleus, migration of amorphous is caused, the amorphous is gradually crystallized and a grain (7) is formed centering on a nucleus. Thus, uneven-shaped HSG is formed on the selective domain surface (FIG. 3(f)). At this point, the grain size can be controlled by controlling the temperature and time of annealing.

After the processing is completed, the boat carrying the semiconductor wafers is unloaded and is returned to the cassette module via the wafer transfer module controlled at 1 Torr by $N_2$ gas.

After forming a silicon nitride film on the semiconductor wafer formed by the first implementation example, oxidizing it and forming the understructure electrode, the C–V measurement of which was taken. The results obtained were 31 fF at −1.5V, 32 fF at +1.5V and Cmin/Cmax of 0.97. As compared with the case where HSG has not been performed, it was found that Cmin/Cmax was equivalent and the capacitance was 2.6 times higher.

Second Embodiment

The second implementation example is now explained. FIG. 4 schematically illustrates the process drawing of the second implementation example according to the present invention. This method that selectively forms a polycrystal silicon film with the uneven shape caused by migration on the amorphous silicon film accumulated on semiconductor substrate comprises a process of substantially cleaning the surface of the amorphous silicon film, a process of heating the amorphous silicon film to a predetermined temperature, a process of selectively forming an amorphous silicon-polysilicon mixed-phase active layer thin film on the amorphous silicon film by surface reaction in a $SiH_4$ atmosphere of predetermined concentration and a process of crystallizing the amorphous silicon surface by annealing it at a predetermined temperature for a predetermined time period and selectively forming a polycrystal silicon film in an uneven shape caused by migration on the amorphous silicon surface. In addition, in the second implementation example, a process of heating the surface of an unevenly-shaped polycrystal silicon film to a predetermined temperature, and a process of selectively forming phosphorus-doped polycrystal silicon on the surface of the unevenly-shaped polycrystal silicon film by surface reaction in a $SiH_4$ and $PH_3$ atmosphere of predetermined concentration are included.

Figure 4A:
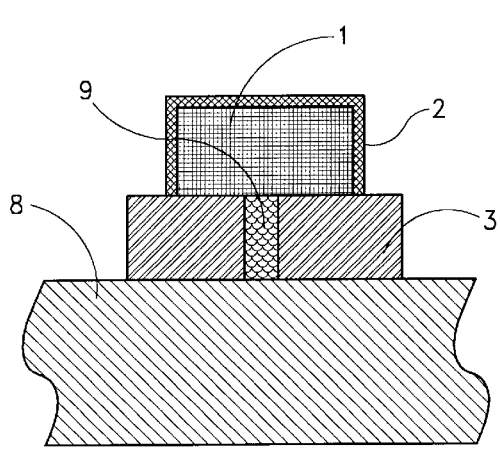
FIGS. 4(a)–4(e) is a schematic view showing a second embodiment of the method for manufacturing semiconductor elements according to the present invention.
Figure 4D:
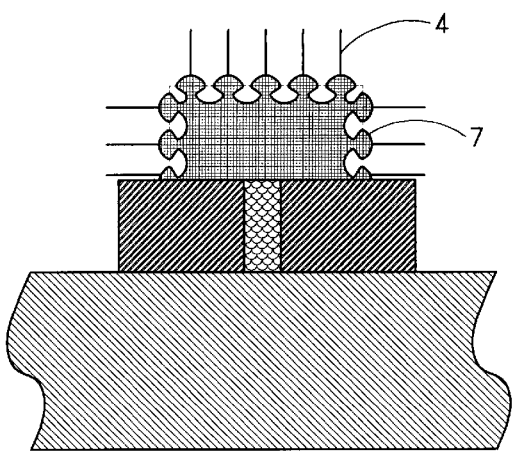
Figure 4B:
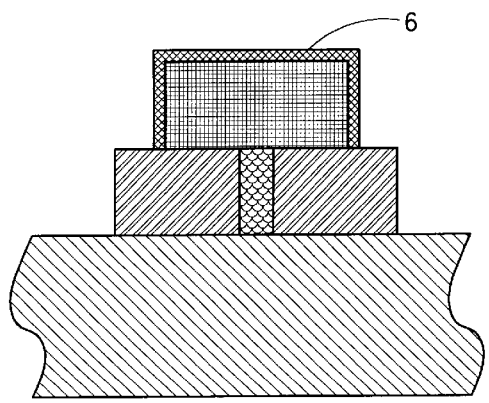
Figure 4E:
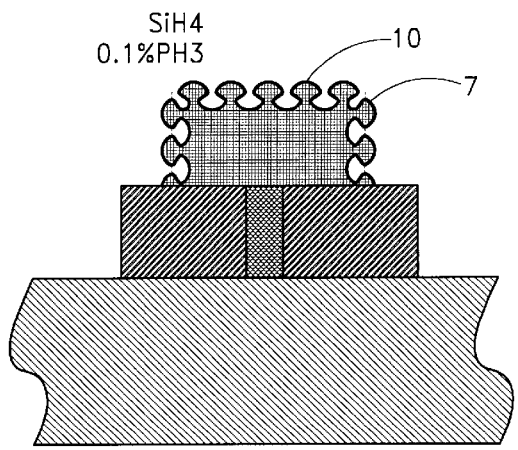
Figure 4C:
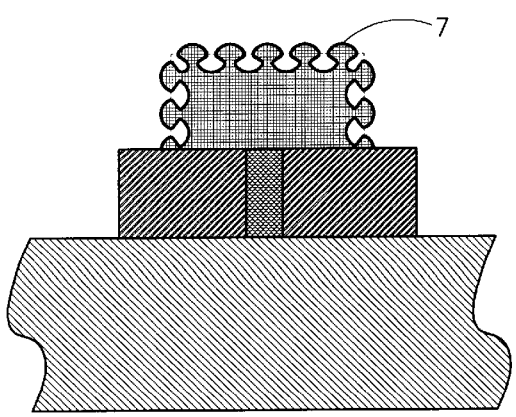

As shown in FIG. 4(a), similarly to the first implementation example, the capacitor electrode comprises an intercalation layer (3) evenly formed on the silicon substrate (8), an amorphous silicon film (1) formed on the intercalation layer (3), and polycrystal silicon (9) linking the amorphous silicon film (1) and the semiconductor substrate (8). Adhered on the amorphous silicon film (1) is naturally formed oxide film (2).

In the second implementation example of the present invention, explanation for the cleaning process of the surface and the heating process is omitted, as they are identical to those for the first implementation example.

When the heating process is completed, the next process is the formation process of the amorphous silicon-polysilicon mixed-phase active layer. In the second implementation example of the present invention, by introducing $SiH_4$ gas diluted at 5%~60% (preferably at 30%~50%) into the surface-reaction thin film formation reactor evacuated at 1 E-3 Torr~1 E-7 Torr, the active amorphous-polysilicon mixed-phase active layer (6) is formed by surface reaction (FIG. 4(b)). At this point, the film thickness of the mixed-phase thin film of amorphous-polycrystal silicon can be controlled by changing the introducing time of $SiH_4$ gas, and the grain density can be controlled by adjusting this film thickness.

The next process is the annealing process. Explanation for the annealing process is omitted, as it is the same as in the first implementation example. At this point, the grain size can be controlled by controlling the temperature and the time of annealing.

Where the second implementation example is largely different from the first implementation example is that it includes a process of heating the unevenly-shaped polycrystal silicon film formed in the above and a process of forming phosphorus-doped polycrystal silicon on the surface of unevenly-shaped polycrystal silicon film.

Subsequently, the boat carrying semiconductor wafers with their surfaces selectively processed to an uneven shape is unloaded and is conveyed to a different reactor via the wafer transfer module controlled at 1 Torr by N2 gas. The boat is then reloaded, heated for approximately 20 minutes until the processing temperature reaches 450° C.~590° C., and the surface is activated (FIG. 4(d)). $SiH_4$ gas diluted at 5%~60% (suitably at 30%~50%) is then introduced first in the surface-reaction thin film formation reactor evacuated at 1 E-3 Torr~1 E-7 Torr. Thereafter, while reducing the helium (He) flow rate of diluted gas, $PH_3$ gas diluted at 0.01%~0.5% (suitably at 0.05%~0.2%) is introduced (FIG. 4(d)). By surface reaction, polycrystal silicon (10) to which phosphorus is doped at a predetermined amount is selectively formed only on the HSG surface (FIG. 4(e)). At this point, the amount of phosphorus to be doped to the polycrystal silicon film can be controlled by adjusting the flow rate of $PH_3$ gas.

After the processing is completed, the gases are stopped and the inside of the reactor is evacuated using a turbo molecular pump. The boat carrying the semiconductor wafers is unloaded and is returned to the cassette module via the wafer transfer module controlled at 1 Torr by N2 gas.

After forming a silicon nitride film on the semiconductor wafer formed by the second implementation example, oxidizing it and forming the understructure electrode, the C–V measurement was taken. The results obtained were 34 fF at −1.5V, 35.5 fF at +1.5V and Cmin/Cmax of 0.96. As compared with the case where HSG processing has not been performed, it was found that Cmin/Cmax was equivalent and the capacitance was 2.8 times higher.

Third Embodiment

The third implementation example of the methods for manufacturing semiconductor elements according to the present invention will be explained. FIG. 5 roughly illustrates the process drawing of the third implementation example for manufacturing semiconductor elements according to the present invention.

This method which forms a phosphorus-doped polycrystal silicon thin film on the surface of polycrystal silicon film with an uneven shape caused by migration, which is selectively formed on the amorphous silicon film accumulated on semiconductor substrate, comprises a process of substantially cleaning the surface of the polycrystal silicon film with an uneven shape, a process of heating the polycrystal silicon film with an uneven shape to a predetermined temperature and a process of selectively forming a phosphorus-doped polycrystal silicon thin film on the polycrystal silicon film with the uneven shape by surface reaction in a $SiH_4$ and PH3 atmosphere of predetermined concentration.

Figure 5A:
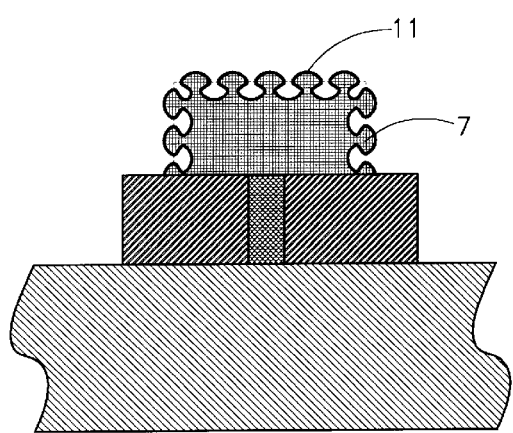
FIGS. 5(a)–5(d) is a schematic view showing a third embodiment of the method for manufacturing semiconductor elements according to the present invention.
Figure 5C:
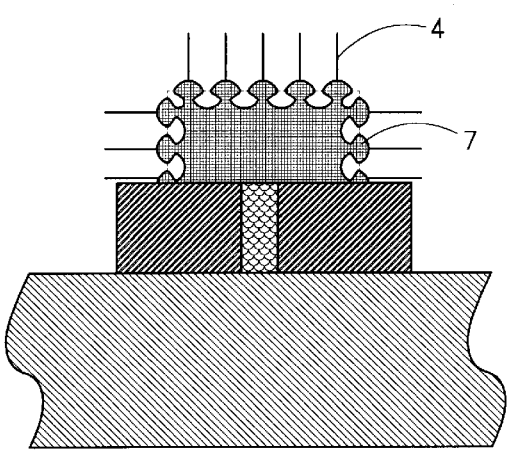
Figure 5B:
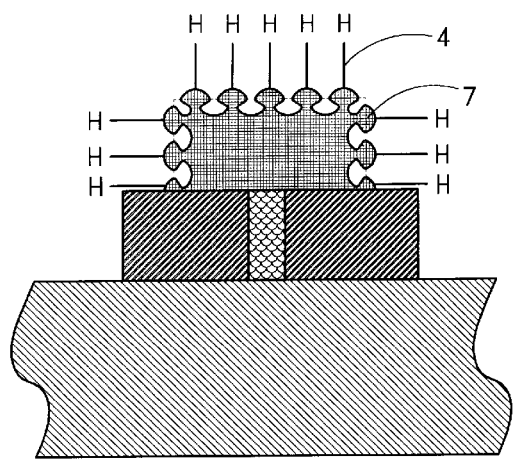
Figure 5D:
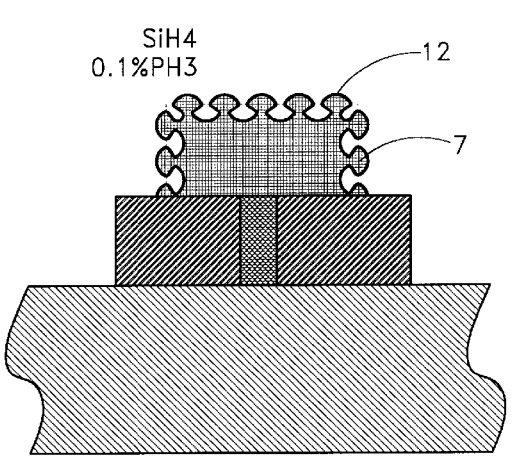

As shown in FIG. 5(a), naturally formed oxide film (11) adheres to the amorphous silicon film surface with the uneven shape caused by migration. Consequently, it is necessry to remove this naturally formed oxide film and clean the surface. Cleaning the surface is done in the same way as explained for the first implementation example.

Hydrogen atoms (5) bonded to the dangling bond (4) on the cleaned polycrystal silicon surface with the uneven shape are then removed and the surface is heated to be activated. Explanation of this heating process is omitted as well, because it is identical to that of the second implementation example.

After the heating process is a process of forming the phosphorus-doped polycrystal silicon (12) on the uneven-shaped polycrystal silicon film surface by surface reaction. Since this process is identical to that of the second implementation example, explanation is omitted.

As in the second implementation example, the amount of phosphorus to be doped to the unevenly-shaped polycrystal silicon film surface can be controlled by adjusting the flow rate of $PH_3$.

After forming a silicon nitride film on the semiconductor wafer formed by the third implementation example, oxidizing it and forming the understructure electrode, the C–V measurement was taken. The results obtained were 28 fF at −1.5V, 29 fF at +1.5V and Cmin/Cmax of 0.97. As compared with the case where HSG processing has not been performed, it was found that Cmin/Cmax was equivalent and the capacitance was 2.3 times higher.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a rough surface made of a doped polycrystal silicon film on an amorphous silicon film disposed on a semiconductor substrate, comprising the steps of:
    activating dangling bonds present on a surface of an amorphous silicon film;
    forming an amorphous silicon-polysilicon mixed-phase layer on the surface of the amorphous silicon film by contacting the dangling bonds with a gas containing silane gas and dopant gas wherein 0.01–0.5% dopant gas is added to silane gas while controlling the ratio of dopant gas to silane gas to bind silicon atoms and dopant atoms to the dangling bonds; and
    annealing the amorphous silicon-polysilicon mixed-phase layer to form polysilicon grains therefrom, thereby forming a rough surface made of doped polysilicon film.

2. The method as claimed in claim 1, wherein the ratio of dopant gas to silane gas is increased from zero to a predetermined level during formation of the amorphous silicon-polysilicon mixed-phase layer.

3. The method as claimed in claim 1, wherein the activation of the dangling bonds is conducted by heating in an inert gas the amorphous silicon film to a temperature of 450° C. to 590° C.

4. The method as claimed in claim 1, wherein the gas contains 5% to 60% silane gas and 0.01% to 0.5% dopant gas.

5. The method as claimed in claim 1, wherein annealing is conducted at a temperature of 450° C. to 590° C.

6. The method as claimed in claim 1, wherein annealing is conducted for 1 minute to 80 minutes.

7. The method as claimed in claim 1, wherein the silane is $SiH_4$.

8. The method as claimed in claim 1, wherein the dopant is phosphorus.

9. A method for forming a rough surface made of a doped polycrystal silicon film on an amorphous silicon film disposed on a semiconductor substrate, comprising the steps of:
    activating dangling bonds present on a rough surface made of a non-doped or insufficiently doped polycrystal silicon film disposed on a semiconductor substrate; and
    contacting the dangling bonds with a gas containing silane gas and dopant gas wherein 0.01–0.5% dopant gas is added to silane gas while controlling the ratio of dopant gas to silane gas to bind silicon atoms and dopant atoms to the dangling bonds, thereby doping the rough surface made of the polysilicon film.

10. The method as claimed in claim 9, wherein the ratio of dopant gas to silane gas is increased from zero to a predetermined level during formation of the amorphous silicon-polysilicon mixed-phase layer.

11. The method as claimed in claim 9, wherein the activation of the dangling bonds is conducted by heating in an inert gas the amorphous silicon film to a temperature of 450° C. to 590° C.

12. The method as claimed in claim 9, wherein the gas contains 5% to 60% silane gas and 0.01% to 0.5% dopant gas.

13. The method as claimed in claim 9, wherein the silane is $SiH_4$.

14. The method as claimed in claim 9, wherein the dopant is phosphorus.

15. The method as claimed in claim 9, wherein said rough surface made of non-doped or insufficiently doped polysilicon film is obtained by the steps of:

forming an amorphous silicon-polysilicon mixed-phase layer on a surface of an amorphous silicon film by contacting the surface with a gas containing silane; and annealing the amorphous silicon-polysilicon mixed-phase layer to form polysilicon grains therefrom, thereby forming said rough surface.

16. The method as claimed in claim 9, further comprising, prior to the activation step, a steps of cleaning the surface of the polysilicon grains to remove, if any, an oxide film naturally formed thereon.

17. The method as claimed in claim 4, wherein to a reactor for forming an amorphous silicon-polysilicon mixed-phase layer, 5–60% silane gas and then 0.01–0.5% dopant gas are introduced.

18. The method as claimed in claim 12, wherein to a reactor for forming an amorphous silicon-polysilicon mixed-phase layer, 5–60% silane gas and then 0.01–0.5% dopant gas are introduced.

* * * * *